(12) United States Patent
Lee et al.

(10) Patent No.: US 12,412,678 B2
(45) Date of Patent: Sep. 9, 2025

(54) FABRICATION METHOD OF CONDUCTIVE NANONETWORKS THROUGH ADAPTATION OF SACRIFICIAL LAYER

(71) Applicant: KOREA ADVANCED INSTITUTE OF SCIENCE AND TECHNOLOGY, Daejeon (KR)

(72) Inventors: Jung-Yong Lee, Daejeon (KR); Kyungmin Kim, Daejeon (KR)

(73) Assignee: KOREA ADVANCED INSTITUTE OF SCIENCE AND TECHNOLOGY, South (KR)

( * ) Notice: Subject to any disclaimer, the term of this patent is extended or adjusted under 35 U.S.C. 154(b) by 257 days.

(21) Appl. No.: 17/539,660

(22) Filed: Dec. 1, 2021

(65) Prior Publication Data

US 2022/0181047 A1    Jun. 9, 2022

(30) Foreign Application Priority Data

Dec. 4, 2020  (KR) .................. 10-2020-0168463
Nov. 5, 2021  (KR) .................. 10-2021-0151154

(51) Int. Cl.
*H01B 1/02* (2006.01)
*B82Y 30/00* (2011.01)
(Continued)

(52) U.S. Cl.
CPC .............. *H01B 1/02* (2013.01); *B82Y 30/00* (2013.01); *B82Y 40/00* (2013.01); *H01B 1/22* (2013.01);
(Continued)

(58) Field of Classification Search
None
See application file for complete search history.

(56) References Cited

U.S. PATENT DOCUMENTS

| | | | |
|---|---|---|---|
| 10,831,233 B2 | 11/2020 | Dodds et al. | |
| 2013/0203198 A1* | 8/2013 | Min | H10K 50/30 438/46 |

(Continued)

FOREIGN PATENT DOCUMENTS

| KR | 1020060018466 A | 3/2006 |
|---|---|---|
| KR | 1020090056038 A | 6/2009 |

(Continued)

OTHER PUBLICATIONS

Yang Jie et al: "High-Performance Transparent Conducting Metal Network Electrodes for Perovksite Photodetectors", Applied Materials & Interfaces, vol. 10, No. 2, Jan. 5, 2018 (Jan. 5, 2018), pp. 1996-2003, XP055833722, ISSN: 1944-8244, DOI: 10.1021/acsami. 7b15205 (Year: 2018).*

(Continued)

*Primary Examiner* — Jose I Hernandez-Kenney
(74) *Attorney, Agent, or Firm* — Calderone McKay, LLC

(57) ABSTRACT

There is provided a fabrication method of conductive nanonetworks through adaptation of a sacrificial layer includes: forming nanowire networks on a substrate; forming the sacrificial layer on a front surface of the substrate including the nanowire networks; removing the nanowire networks to expose a surface of the substrate within a region from which the nanowire networks are removed; forming a conductive material on the front surface of the substrate to fill the region, from which the nanowire networks are removed, with the conductive material while forming the conductive material on the sacrificial layer; and forming conductive nanonetworks made of the conductive material which fills the region from which the nanowire networks are removed, by removing the sacrificial layer.

6 Claims, 26 Drawing Sheets

(51) Int. Cl.
  B82Y 40/00 (2011.01)
  H01B 1/22 (2006.01)
  *C23C 14/04* (2006.01)
  *C23C 16/04* (2006.01)
  *C23C 30/00* (2006.01)
  *H01B 13/00* (2006.01)
  *H10F 71/00* (2025.01)
  *H10F 77/20* (2025.01)

(52) U.S. Cl.
  CPC .......... *C23C 14/042* (2013.01); *C23C 16/042* (2013.01); *C23C 30/00* (2013.01); *H01B 13/0026* (2013.01); *H10F 71/138* (2025.01); *H10F 77/244* (2025.01)

(56) References Cited

U.S. PATENT DOCUMENTS

| | | | | |
|---|---|---|---|---|
| 2016/0358747 | A1* | 12/2016 | Zhu | C25D 5/48 |
| 2023/0183850 | A1* | 6/2023 | Sheerin | C23C 14/20 427/540 |

FOREIGN PATENT DOCUMENTS

| | | |
|---|---|---|
| KR | 1020090075957 A | 7/2009 |
| KR | 101011447 B1 | 7/2010 |
| KR | 1020130039017 A | 4/2013 |
| KR | 1020130066724 A | 6/2013 |
| KR | 101303988 B1 | 9/2013 |
| KR | 1020150042634 A | 4/2015 |
| KR | 1020170095054 A | 8/2017 |
| KR | 1020180031179 A | 3/2018 |
| KR | 101851641 B1 | 4/2018 |

OTHER PUBLICATIONS

Korean Notice of Allowance in Korean Foreign Priority Application No. 10-2021-0151154, Aug. 14, 2024, 4 pages, with English translation.

* cited by examiner

FABRICATION METHOD OF CONDUCTIVE NANONETWORKS THROUGH ADAPTATION OF SACRIFICIAL LAYER

CROSS-REFERENCE TO RELATED APPLICATION

This application claims priorities to Korean patent application No. 10-2020-0168463, filed on Dec. 4, 2020 and Korean patent application No 10-2021-0151154, filed on Nov. 5, 2021. The contents of the applications are incorporated herein by reference in their entirety.

BACKGROUND

1. Field

The present disclosure relates to a fabrication method of conductive nanonetworks through the adaptation of a sacrificial layer, and more specifically, to a fabrication method of conductive nanonetworks through the adaptation of a sacrificial layer by which electrical properties and optical properties of the conductive nanonetworks can be improved by minimizing surface roughness and excluding contact resistance between nanowires in connecting a conductive material into a nanonetwork shape.

[National R&D Program Which Supports This Invention]
[Project Identification Number] 1711119623
[Project Number] 2020M3H4A1A02084906
[Ministry Name] Ministry of Science and ICT
[Project Management (Specialized) Agency Name] National Research Foundation of Korea
[Research Program Name] Source Technology Development of Future Nano-Material (R&D)
[Research Project Title] Development of technology for optimizing high-efficient material and element for 100%-or-more-stretchable material-specific stretchable organic solar cell
[Contribution Rate] 34/100
[Project Implementation Institute Name] Korea Advanced Institute of Science and Technology
[Research Period] Jul. 1, 2020 to Dec. 31, 2020
[National R&D Program Which Supports This Invention]
[Project Identification Number] 1711120360
[Project Number] 2020M3D1A2102869
[Ministry Name] Ministry of Science and ICT
[Project Management (Specialized) Agency Name] National Research Foundation of Korea
[Research Program Name] Future Material Discovery Support (R&D)
[Research Project Title] Development of new high-performance material and element for electrochromic transparent display for vehicle
[Contribution Rate] 33/100
[Project Implementation Institute Name] University of Seoul
[Research Period] Jul. 23, 2020 to Jan. 22, 2021
[National R&D Program Which Supports This Invention]
[Project Identification Number] 1711135134
[Project Number] 2020R1A4A1018516
[Ministry Name] Ministry of Science and ICT
[Project Management (Specialized) Agency Name] National Research Foundation of Korea
[Research Program Name] Group Research Support (R&D)
[Research Project Title] Development of stretchable solar cell with consistent performance
[Contribution Rate] 33/100
[Project Implementation Institute Name] Korea Advanced Institute of Science and Technology
[Research Period] Jun. 1, 2021 to Feb. 28, 2022

2. Description of the Related Art

Indium tin oxide (ITO) having properties of optical transmittance of about 85% and sheet resistance of 15 Ω/sq is widely used for nanoelectrodes of various display modules. However, limited reserves and mines of an indium component in ITO result in unstable supply and demand and a relatively high price thereof. In addition, an ITO deposition process has to be performed by expensive and large-sized vacuum equipment with high maintenance costs, and the oxide has a property of brittleness and thus is not suitable to be applied to a flexible electrode.

Recently, research on a conductive nanofilm using flexible metal nanowires which can be produced through a low temperature process has been actively carried out. In other words, research on a conductive nanofilm which is fabricated into a mesh shape by using metal nanowires and is used to function as a nanoelectrode of a flexible substrate or the like has been carried out. Typically, a method of fabricating a mesh-shaped conductive nanofilm by randomly distributing metal nanowires through a solution process using a nanowire solution or the like is used.

However, in a case of the conductive nanofilm using metal nanowires according to the related art, the conductive nanofilm is formed with metal nanowires being overlapped on one another, and thus the method in the related art has drawbacks of unavoidable contact resistance between metal nanowires and high surface roughness. In addition, a post-processing treatment such as a heat treatment or a laser treatment is required in order to reduce the contact resistance between metal nanowires, and the treatment is a process unsuitable for a flexible polymer substrate. Besides, the solution process according to the related art is difficult to apply to a very hydrophobic substrate.

SUMMARY

The present disclosure is made to solve problems described above, and an object thereof is to provide a fabrication method of conductive nanonetworks through the adaptation of a sacrificial layer by which electrical properties and optical properties of the conductive nanonetworks can be improved by minimizing surface roughness and excluding contact resistance between nanowires in connecting a conductive material into a nanonetwork shape.

In addition, another object of the present disclosure is to provide a fabrication method of conductive nanonetworks through the adaptation of a sacrificial layer by which a line width, density, and a height of the conductive nanonetworks can be controlled by adjusting a diameter and density of nanowire networks, a height of the sacrificial layer, and the like in a process of fabricating the conductive nanonetworks, and thereby electrical properties and optical properties of the conductive nanonetworks can be selectively adjusted.

A fabrication method of conductive nanonetworks through adaptation of a sacrificial layer according to the invention to achieve the objects includes: forming nanowire networks on a substrate; forming the sacrificial layer on a front surface of the substrate including the nanowire networks; removing the nanowire networks to expose a surface of the substrate within a region from which the nanowire networks are removed; forming a conductive material on the front surface of the substrate to fill the region, from which the nanowire networks are removed, with the conductive material while forming the conductive material on the sacrificial layer; and removing the sacrificial layer to form conductive nanonetworks made of the conductive material which fills the region from which the nanowire networks are removed.

A diameter and density of the nanowire networks and a height of the sacrificial layer may be adjustable. A line width, density, and a height of the conductive nanonetworks may be controllable through adjustment of the diameter and density of the nanowire networks and the height of the sacrificial layer.

In the removing of the nanowire networks to expose the surface of the substrate within the region from which the nanowire networks are removed, the sacrificial layer present on the nanowire networks may be removed together with the nanowire networks, and the sacrificial layer present on the substrate may remain.

In the removing of the nanowire networks to expose the surface of the substrate within the region from which the nanowire networks are removed, the nanowire networks and the sacrificial layer may have different dissolution selectivity from each other, and the sacrificial layer may remain on the substrate during the removing of the nanowire networks with a proper solvent.

The nanowire networks may be formed through electrospinning.

A diameter of the nanowire networks may be adjustable depending on a process condition of an electrospinning device. The diameter of the nanowire networks which are to be formed on the substrate may be adjustable by adjusting at least one of a diameter of a needle of the electrospinning device, a voltage applied to the needle, and a concentration of a solution containing a material which is used to form the nanowire networks. In addition, density of the nanowire networks may be adjustable by adjusting a process time of the electrospinning. Besides, the diameter, a height, and surface roughness of the nanowire networks, bonding of the nanowire networks to the substrate, and the like may be adjustable using a post-processing treatment such as a heat treatment or evaporation solvent exposure after an electrospinning process.

The substrate is any one of a flexible substrate, a semiconductor substrate, an insulation substrate, and an elastic substrate. In addition, the conductive material may be any one of conductive metal, a carbon-based conductive material, conductive polymer, and conductive nanoparticles, or a combination thereof.

BRIEF DESCRIPTION OF THE DRAWINGS

The above and other aspects, features and advantages of the disclosed example embodiments will be more apparent from the following detailed description taken in conjunction with the accompanying drawings in which.

DETAILED DESCRIPTION

Figure 1:
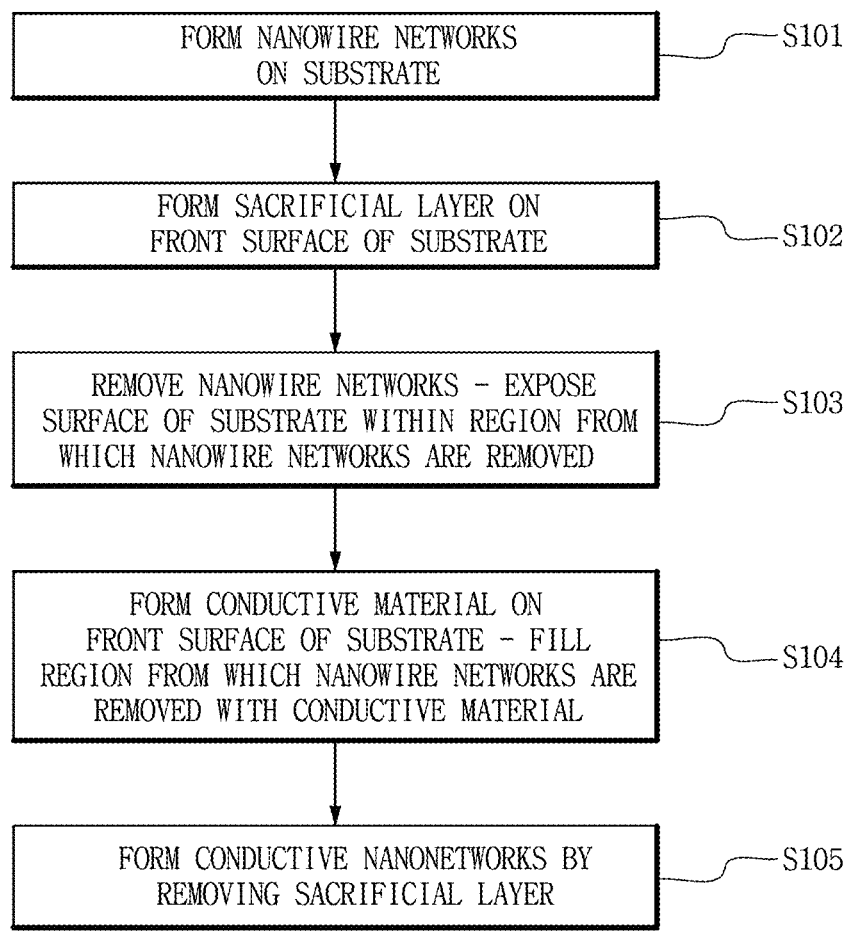
FIG. 1 is a flowchart for illustrating a fabrication method of conductive nanonetworks through the adaptation of a sacrificial layer according to an embodiment of the invention.

Example embodiments are described more fully hereinafter. The example embodiments may, however, be embodied in many different forms and should not be construed as limited to the example embodiments set forth herein. In the description, details of features and techniques may be omitted to more clearly disclose example embodiments.

The terminology used herein is for the purpose of describing particular embodiments only and is not intended to be limiting. As used herein, the singular forms "a," "an" and "the" are intended to include the plural forms as well, unless the context clearly indicates otherwise. Furthermore, the use of the terms a, an, etc. do not denote a limitation of quantity, but rather denote the presence of at least one of the referenced item.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. All methods described herein can be performed in a suitable order unless otherwise indicated herein or otherwise clearly contradicted by context. The use of any and all examples, or exemplary language (e.g., "such as"), is intended merely to better illustrate the example embodiments and does not pose a limitation on the scope of the present disclosure unless otherwise claimed. No language in the specification should be construed as indicating any non-claimed element as essential to the practice of the present disclosure as used herein.

The term "comprises" or "includes" as used herein throughout this specification, specifies presence of stated elements, but does not preclude presence or addition of one or more other elements unless the context clearly indicates otherwise.

The present disclosure provides a technology of fabricating conductive nanonetworks through a new process.

As described above in 'Description of the Related Art', a conductive nanofilm made of metal nanowires is provided to substitute for an ITO nanoelectrode of the related art, and the conductive metal-nanowire nanofilm is fabricated typically through a solution process using a nanowire solution. The solution process using a nanowire solution is a process of forming a conductive nanofilm having a configuration in which metal nanowires are connected to one another, by applying a solution containing dispersed metal nanowires on a substrate and removing a solvent. The conductive nanofilm made of metal nanowires can be fabricated through the process; however, the metal nanowires which are randomly dispersed in a solution are connected to one another in an overlapping manner. Hence, a finally fabricated conductive metal-nanowire nanofilm unavoidably has high surface roughness and contact resistance between nanowires, and it is not possible to adjust a height of the conductive metal-nanowire nanofilm.

According to example embodiments of the present disclosure, the conductive nanonetworks are fabricated through adaptation of a sacrificial layer. In the fabrication method according to example embodiments of the present disclosure, the contact resistance between nanowires is excluded, and the surface roughness of the finally fabricated conductive nanonetworks is minimized. In addition, according to the fabrication method of example embodiments of the present disclosure, a line width, density, and a height of the conductive nanonetworks can be selectively adjusted, and thus the electrical properties and the optical properties of the conductive nanonetworks can be controlled. Here, the line width and density of the conductive nanonetworks can be adjusted by controlling a process condition of the nanowire networks, and a height of the conductive nanonetworks can be controlled by adjusting a height of the sacrificial layer.

In the example embodiments of the present disclosure, the 'conductive nanonetwork' means that a conductive material forms a nanosized network. The 'conductive nanonetwork' in the example embodiments of the present disclosure corresponds to 'forming a mesh shape by metal nanowires' in the related art; however, the term 'conductive nanonetwork' is used in the example embodiments of the present disclosure to be differentiated from the related art using the metal nanowires and to emphasize a difference the example embodiments of the present disclosure and the related art. In the related art, connection between metal nanowires is induced by using a solution in which metal nanowires are dispersed in advance; on the other hand, in the example embodiments of the present disclosure, direct forming of the 'nanosized network by the conductive material' is performed without using metal nanowires, and thus the 'conductive nanonetwork' in the example embodiments of the present disclosure can be described to have a technical configuration different from that of 'forming the mesh shape by metal nanowires' in the related art.

In the present disclosure, the conductive nanonetworks are fabricated through the adaptation of a sacrificial layer, and the present disclosure will be specifically described with an example embodiment, hereinafter. The fabrication method of conductive nanonetworks through the adaptation of a sacrificial layer according to an example embodiment of the present disclosure is as follows.

Figure 2:
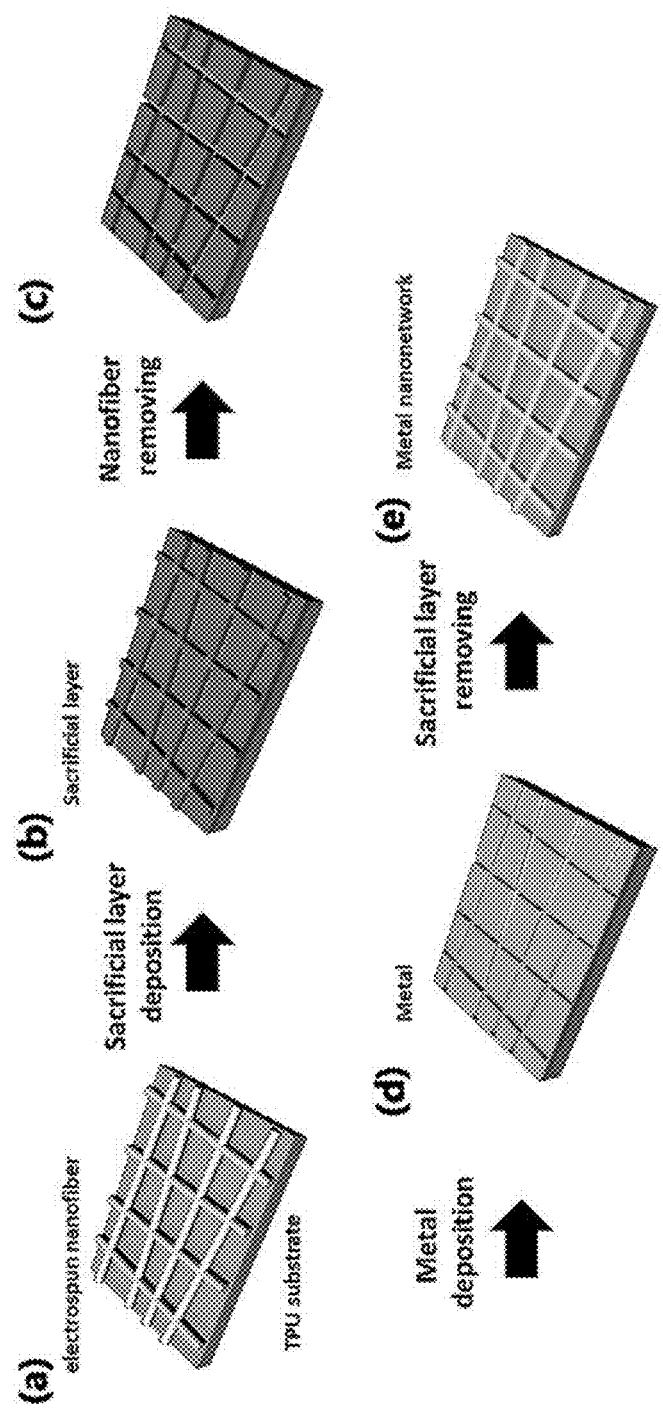
FIG. 2 is a schematic view for illustrating the fabrication method of conductive nanonetworks through the adaptation of a sacrificial layer according to the embodiment of the invention.
Figure 3A:
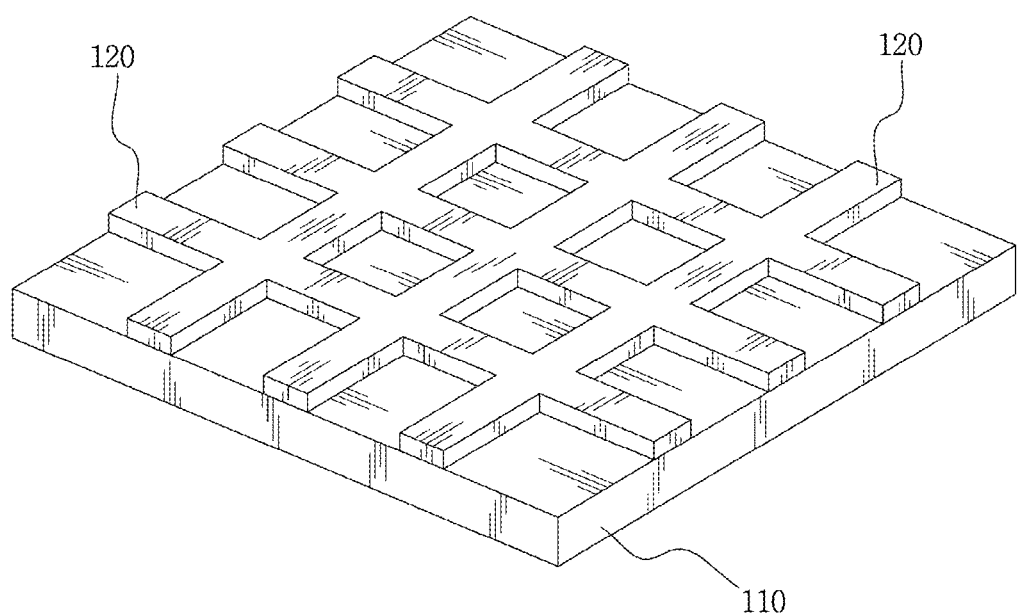
FIGS. 3A to 3E are sectional views of a process for illustrating the fabrication method of conductive nanonetworks through the adaptation of a sacrificial layer according to the embodiment of the invention.

With reference to FIGS. 1 to 3E, first, a substrate 110 is prepared, and nanowire networks 120 are formed on the substrate 110 (S101, refer to (a) of FIG. 2 and FIG. 3A). Materials and types of substrate 110 are not limited. A semiconductor substrate 110 made of various materials can be used, an insulation substrate 110 such as a glass substrate 110 can be used, or a flexible polymer substrate 110 or an elastic substrate having elasticity can be used. Since an object of the present disclosure is to fabricate a nanoelectrode which can have a large area and can be used as the flexible substrate 110, the following embodiment and experimental example will be described with the flexible substrate 110 as an example.

In a state where the substrate 110, for example, the flexible substrate 110, is prepared, nanowire networks 120 are formed on the substrate 110, and the nanowire networks 120 fulfills a function of defining a geometric shape of the conductive nanonetworks 150 in forming the conductive nanonetworks 150. A location and a geometric shape of the nanowire networks 120 are virtually the same as those of the conductive nanonetworks 150.

The nanowire networks 120 having virtually the same geometric shape as that of the conductive nanonetworks 150 can be formed through electrospinning in the embodiment, and the process of forming the networks is not limited thereto. In a case of using the electrospinning process, the nanowire networks 120 can be formed through electrospinning of a solution onto the substrate 110, the solution containing a material which forms the nanowire networks 120. Various polymer materials can be used as the material that forms the nanowire networks 120, and examples of the materials can include poly(methyl methacrylate) (PMMA) and poly(N-vinylpyrrolidone) (PVP). When PVP is used as the material of the nanowire networks 120, water ($H_2O$) can be used as a nanowire network dissolving solution, and thus various substrates such as a thermoplastic polyurethane substrate, which do not need to have oxidation resistance, can be used.

In addition, when a material which forms the nanowire networks 120 is used, the material may need to have dissolution selectivity different from a material of a sacrificial layer 130, and the dissolution selectivity will be described below. For reference, actual nanowire networks 120 form a chaotically structured nanowire shape; however, FIGS. 3A to 3E illustrate the nanowire networks 120 in a grid shape for convenience of description.

In a case of forming the nanowire networks 120 on the flexible substrate 110 by using an electrospinning method, a diameter of the nanowire networks 120 can be adjusted by a process condition of the electrospinning. Specifically, an electrospinning device is configured to include a needle through which spinning of a solution is performed and a high-voltage generator that applies a voltage to the needle, and the diameter of the nanowire networks 120 which are to be formed on the substrate 110 can be adjusted by adjusting at least one of a diameter of the needle, the voltage applied to the needle, and a concentration of a solution containing a material which is used to form the nanowire networks 120. As described above, the geometric shape of the nanowire networks 120 is virtually the same as that of the conductive nanonetworks 150, and thus adjustment of the diameter of the nanowire networks 120 means adjustment of a line width of the conductive nanonetworks 150.

Hence, the diameter of the nanowire networks 120 can be adjusted by adjusting at least one of the diameter of the needle of the electrospinning device, the voltage applied to the needle, and the concentration of the solution containing the material which is used to form the nanowire networks 120, and thus the line width of the conductive nanonetworks 150 can be controlled. In addition, the density of the nanowire networks 120 can be adjusted by adjusting a process time of the electrospinning, and thus the density of the conductive nanonetworks 150 can be selectively adjusted. FIGS. 4A to 4C and 5A to 5D are photomicrographs and SEM pictures illustrating density of the nanowire networks depending on a process time of electrospinning. Here, the density of the nanowire networks 120 or the density of the conductive nanonetworks 150 means density of the nanowire networks or the conductive nanonetworks per unit area of the substrate.

Since the line width and the density of the conductive nanonetworks 150 are directly associated with the electrical properties and the optical properties of the conductive nanonetworks 150, the electrical properties and the optical properties of the conductive nanonetworks 150 can be eventually controlled by adjusting the diameter and the density of the nanowire networks 120. On the other hand, a height of the conductive nanonetworks 150 can also be adjusted, and the height can be controlled by adjusting a height of the sacrificial layer 130 to be described below.

Figure 3B:
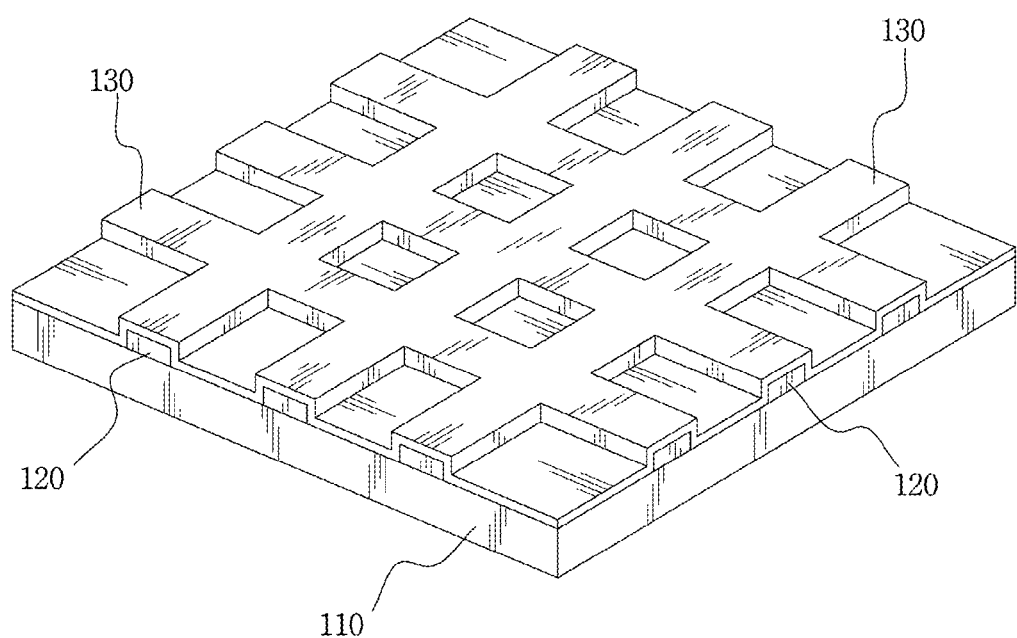

In a state where the nanowire networks 120 are formed on the flexible substrate 110, the sacrificial layer 130 is formed to have a uniform thickness on a front surface of the substrate 110 including the nanowire networks 120 (S102, refer to (b) of FIG. 2 and FIG. 3B). The material and the forming method of the sacrificial layer 130 are not limited, and physical vapor deposition (PVD), chemical vapor deposition (CVD), spin-coating, printing, or the like can be used as the forming method as an embodiment, and an organic material, an insulation film such as silicon oxide film, or the like can be used as the material of the sacrificial layer 130. In an experimental example to be described below, fullerene is used as the material of the sacrificial layer 130.

Figure 3C:
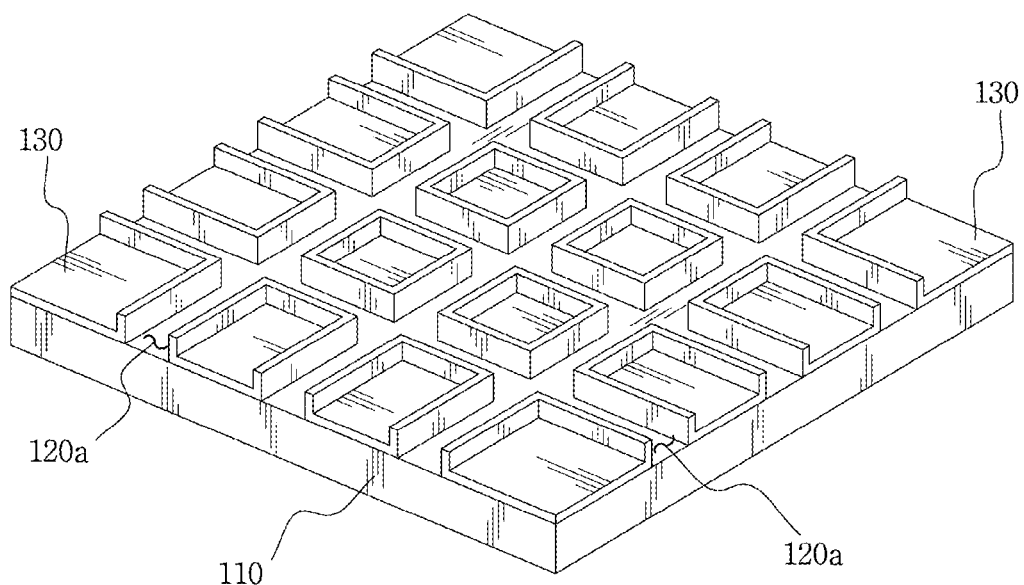

In a state where the sacrificial layer 130 is formed on the front surface of the substrate 110 including the nanowire networks 120, the nanowire networks 120 are selectively removed (S103, refer to (c) of FIG. 2 and FIG. 3C). As the nanowire networks 120 are removed, the sacrificial layer 130 formed on the nanowire networks 120 is also removed, and thus a surface of the substrate 110 within a region 120*a*, from which the nanowire networks 120 are removed, is exposed.

The nanowire networks 120 can be removed using a proper solvent. In other words, only the nanowire networks 120 can be selectively removed using the solvent, and the sacrificial layer 130 formed in contact with the substrate 110 is not removed. In order to selectively remove only the nanowire networks 120 without removing the sacrificial layer 130, the material of the sacrificial layer 130 and the material of the nanowire networks 120 have to have different dissolution selectivity from each other. In an experimental example to be described below, PMMA and PVP are used as the respective materials of the nanowire networks 120, and fullerene is used as the material of the sacrificial layer 130. Acetone is used as the proper solvent of the nanowire networks in a case of using PMMA, and water ($H_2O$) is used as the proper solvent of the nanowire networks in a case of using PVP.

Figure 3D:
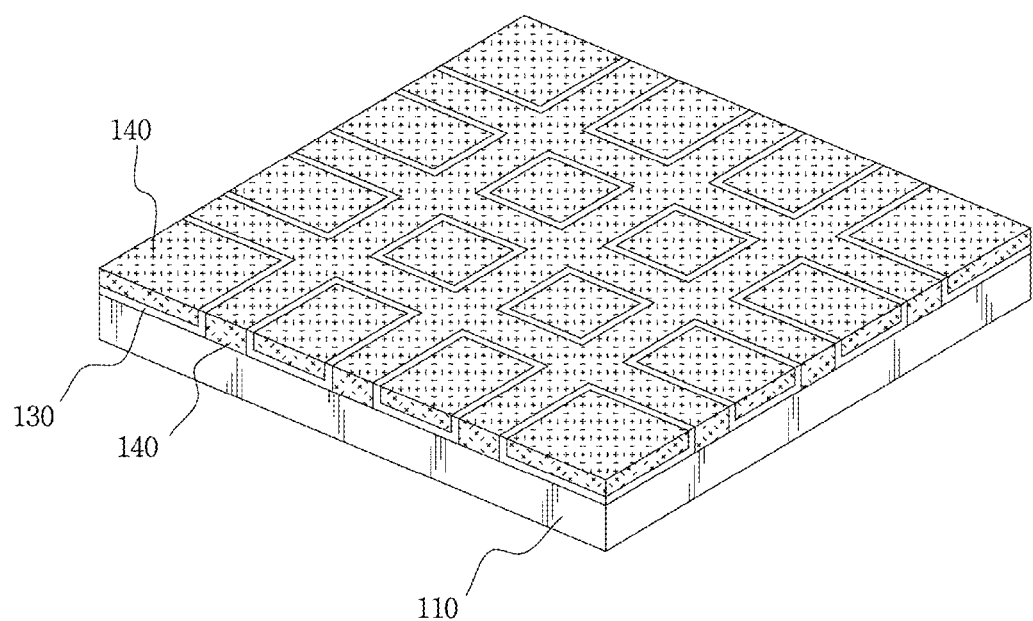

In a state where the surface of the substrate 110 within the region 120*a* from which the nanowire networks 120 are removed by selectively removing the nanowire networks 120, a conductive material 140 is formed on the front surface of the substrate 110 (S104, refer to (d) of FIG. 2 and FIG. 3D). Consequently, the conductive material 140 is formed on the sacrificial layer 130, and the region 120*a*, from which the nanowire networks 120 are removed, are filled with the conductive material 140. The conductive material 140 which is used to fill the region 120*a*, from which the nanowire networks 120 are removed, virtually means the conductive nanonetworks 150.

In the description provided above, the nanowire networks 120 are described to have virtually the same geometric shape as the conductive nanonetworks 150. The region 120*a*, from which the nanowire networks 120 are removed, is filled with the conductive material 140 such that the conductive nanonetworks 150 are formed, and thus it can be found that the nanowire networks 120 and the conductive nanonetworks 150 have the same geometric shape.

The geometric shape of the nanowire networks 120 is virtually the same as that of the conductive nanonetworks 150; however, the height of the conductive nanonetworks 150 can be adjusted to be different from the height of the nanowire networks 120. Specifically, when the sacrificial layer 130 is formed to have a height higher than the height of the nanowire networks 120 during forming the sacrificial layer 130, the height of the conductive nanonetworks 150 can be higher than the height of the nanowire networks 120.

On the other hand, various materials can be used as the conductive material 140 which forms the conductive nanonetworks 150. Examples of the conductive material can include conductive metal such as Ag, Au, Al, Cu, or Ga, a carbon-based conductive material such as graphene or CNT, conductive polymer, conductive nanoparticles, and the like, and a combination of these conductive materials 140.

Figure 3E:
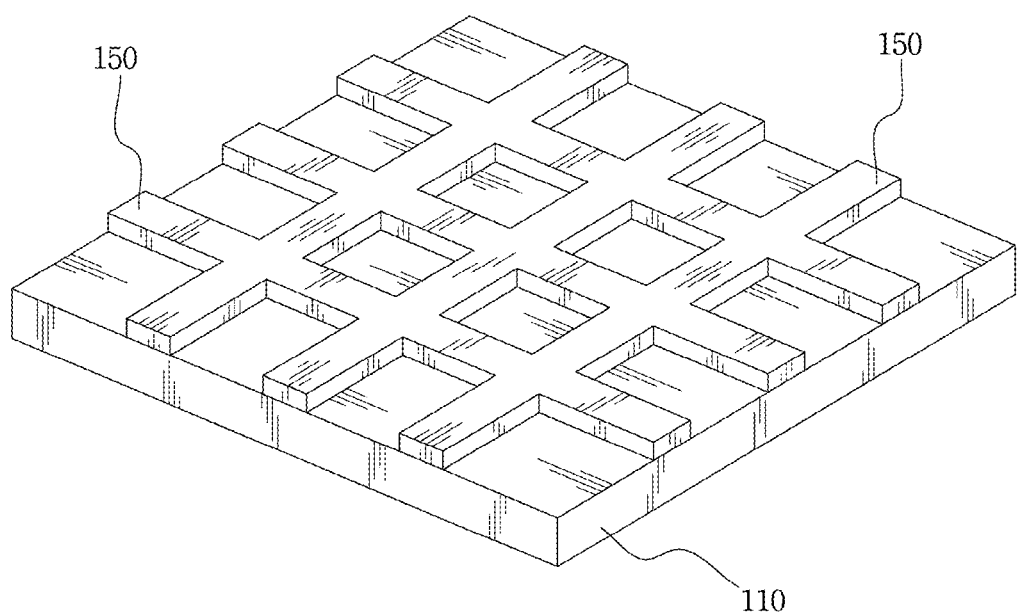
Figure 4A:
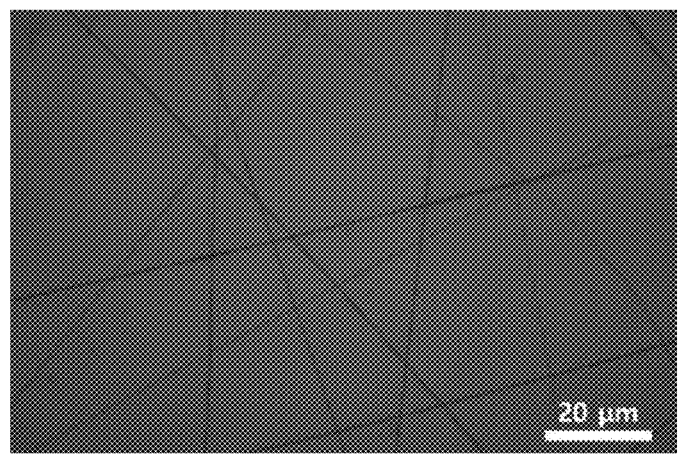
FIGS. 4A to 4C and 5A to 5D are photomicrographs and SEM pictures illustrating density of nanowire networks depending on a process time of electrospinning.
Figure 4B:
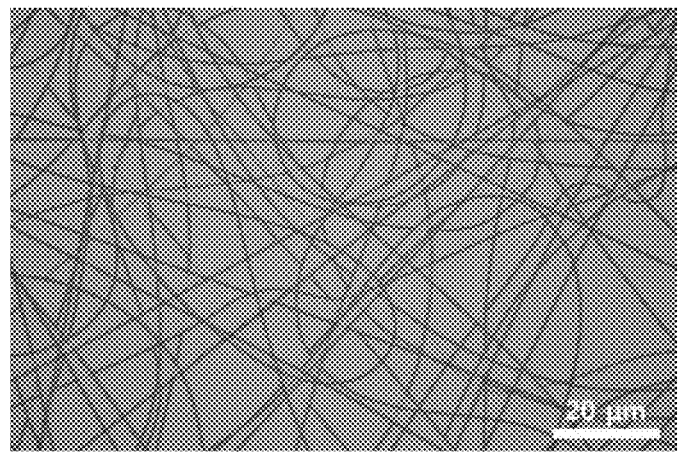
Figure 4C:
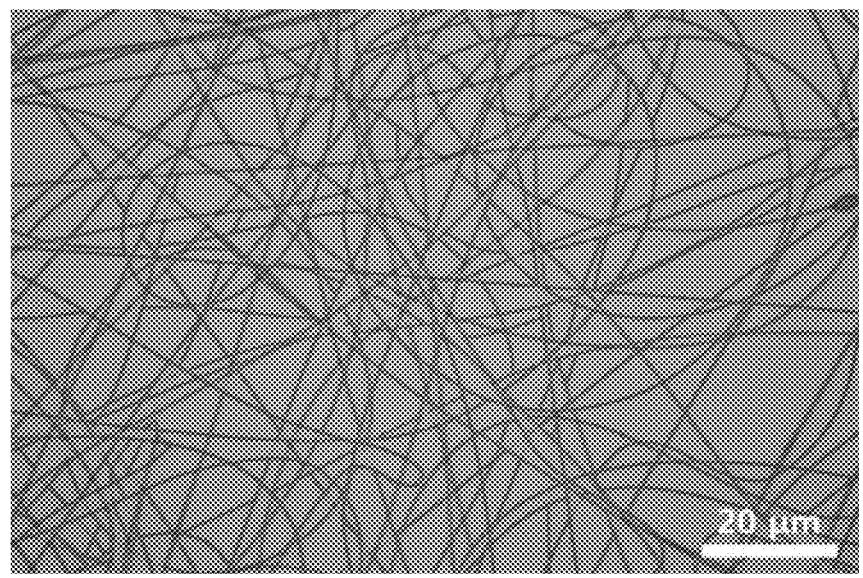
Figure 5A:
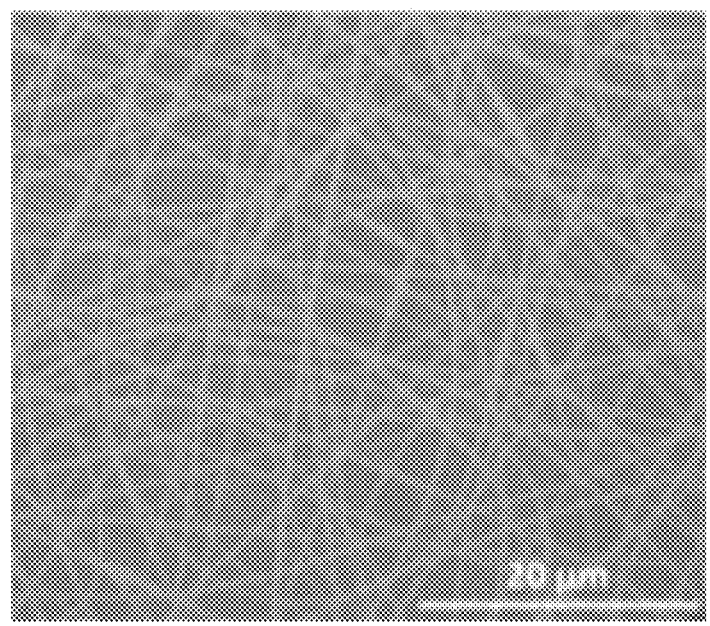
Figure 5B:
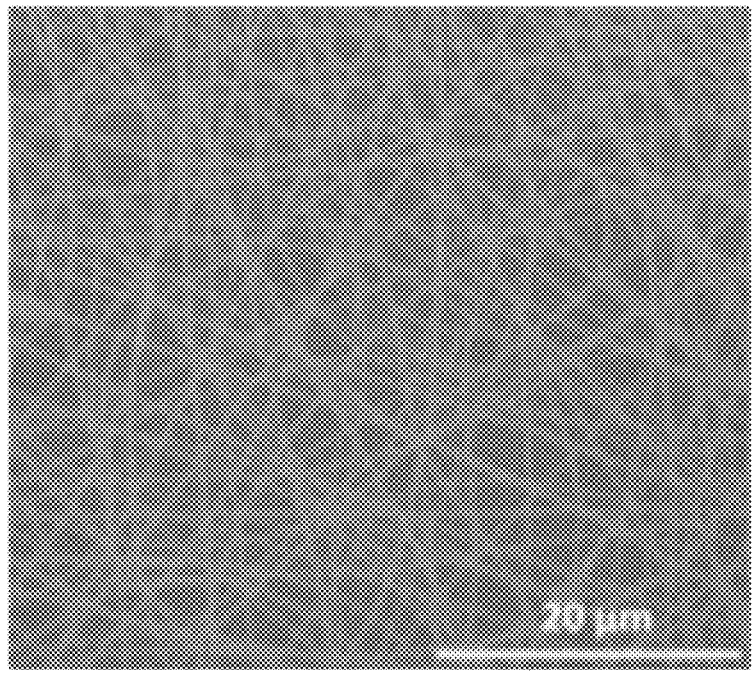
Figure 5C:
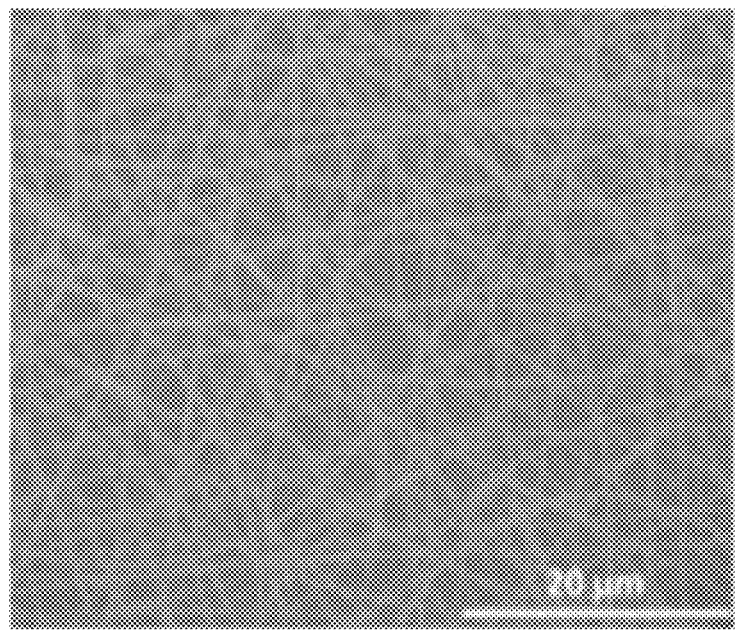
Figure 5D:
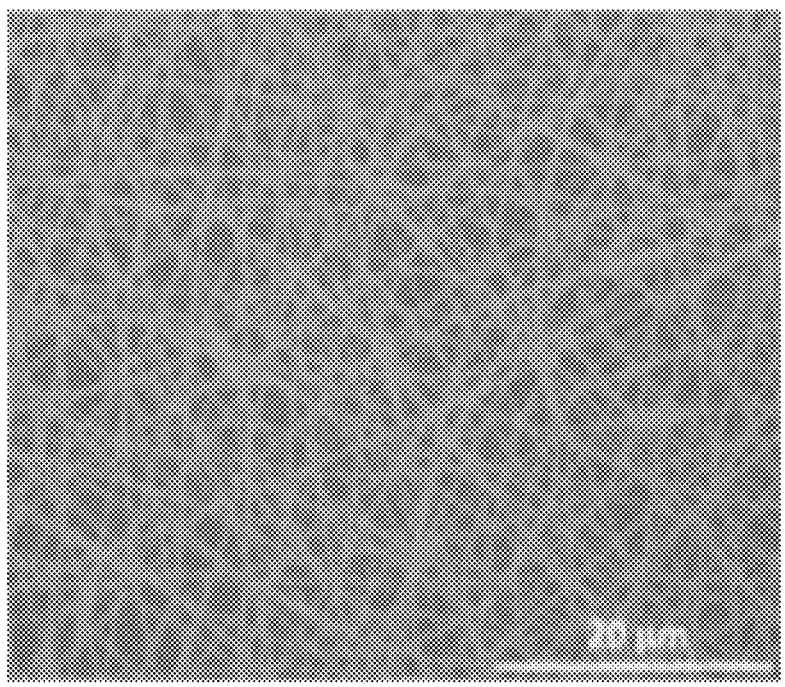
Figure 6:
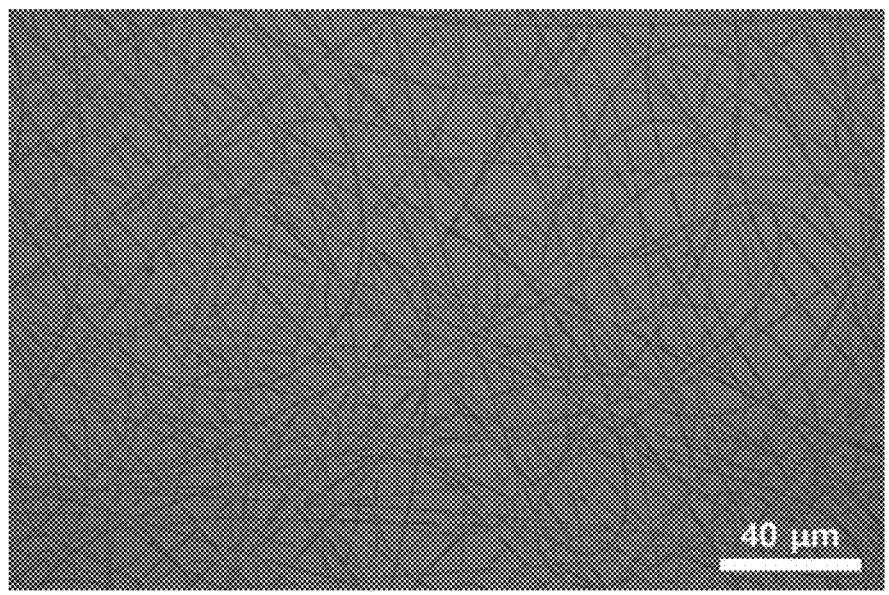
FIG. 6 illustrates a photomicrograph of a substrate on which PVP is formed.

In a state where the region 120*a*, from which the nanowire networks 120 are removed, is filled with the conductive material 140 together with formation of the conductive material 140 on the sacrificial layer 130, the sacrificial layer 130 is removed, and the fabrication method of conductive nanonetworks 150 through the adaptation of the sacrificial layer 130 according to the embodiment of the present disclosure is completed (S105, refer to (e) of FIG. 2 and FIG. 3E). As the sacrificial layer 130 is removed, the conductive material 140 on the sacrificial layer 130 is also removed, and only the conductive material 140 which is used to fill the region 120*a*, from which the nanowire networks 120 are removed, is present on the substrate 110. The conductive material 140 finally present on the substrate 110 forms networks having virtually the same shape as the nanowire networks 120 and is referred to as the conductive nanonetworks 150 in the present disclosure.

As known from the fabrication method described above, a method of inducing connection between metal nanowires is used in the related art, whereas a method of forming the conductive nanonetworks by filling the region, from which the nanowire networks are removed, with the conductive material is used in the present disclosure. Hence, the 'conductive nanonetworks' of the present disclosure can be accepted as a technical configuration different from that of 'forming the mesh shape with metal nanowires' in the related art.

In addition, the example embodiments of the present disclosure may be realized by the method of forming the conductive nanonetworks by filling the region, from which the nanowire networks are removed, with the conductive material and a configuration in which connection between metal nanowires is excluded, and thus the surface roughness of the conductive nanonetworks is more minimized, and the electrical properties and the optical properties are more improved than those in the related art. Besides, as described above, the line width, the density, and the height of the conductive nanonetworks can be adjusted by adjusting the diameter and the density of the nanowire networks and the height of the sacrificial layer, and thus the electrical properties and the optical properties of the conductive nanonetworks can be selectively controlled.

The fabrication method of conductive nanonetworks through the adaptation of a sacrificial layer according to the example embodiments of the present disclosure is described as above. Hereinafter, the example embodiments of the present disclosure will be more specifically described with experimental examples.

Experimental Example: Fabrication and Property Analysis of Conductive Nanonetworks Electrospinning of poly(methyl methacrylate) (PMMA) is performed on a thermoplastic polyurethane substrate. Next, C60 fullerene is deposited through sputtering to have a thickness of 70 nm to 450 nm on the substrate. Then, PMMA is removed using acetone. Subsequently, Ag is deposited to have a thickness of 20 nm to 100 nm on a front surface of the substrate, and C60 fullerene is removed such that conductive nanonetworks made of Ag is completed.

In addition, electrospinning of poly(N-vinylpyrrolidone) (PVP) is performed on a thermoplastic polyurethane substrate. Next, C60 fullerene is deposited through sputtering to have a thickness of 70 nm to 450 nm on the substrate. Then, PVP was removed using water ($H_2O$). Subsequently, Ag is deposited to have a thickness of 20 nm to 100 nm on a front surface of the substrate, and C60 fullerene is removed such that conductive nanonetworks made of Ag was completed.

Figure 7A:
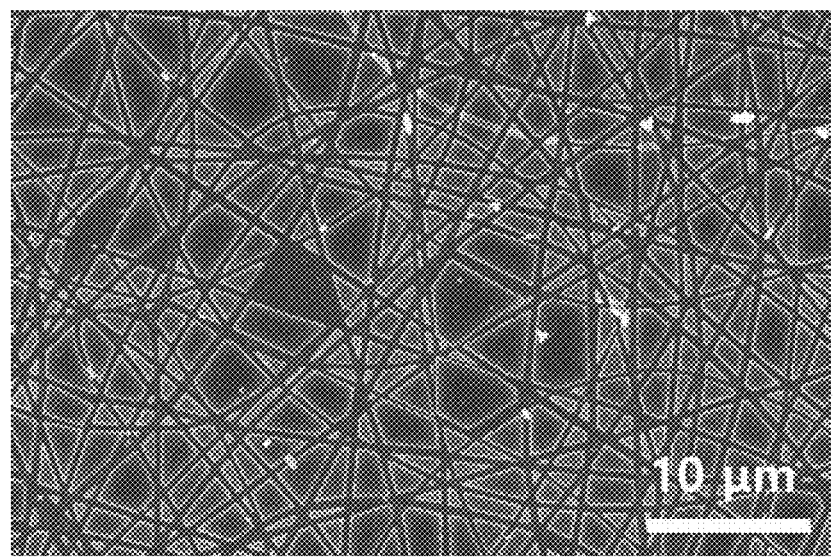
FIGS. 7A to 7C illustrate SEM pictures of a substrate from which PMMA or PVP is removed.
Figure 7B:
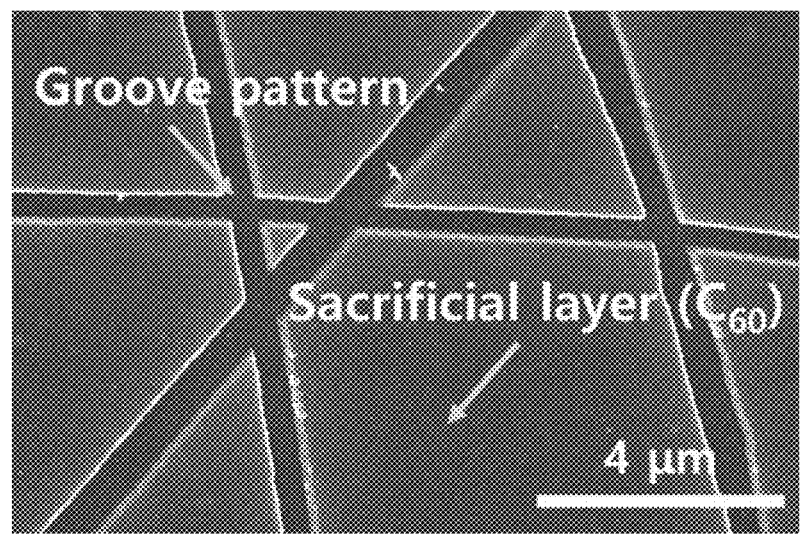
Figure 7C:
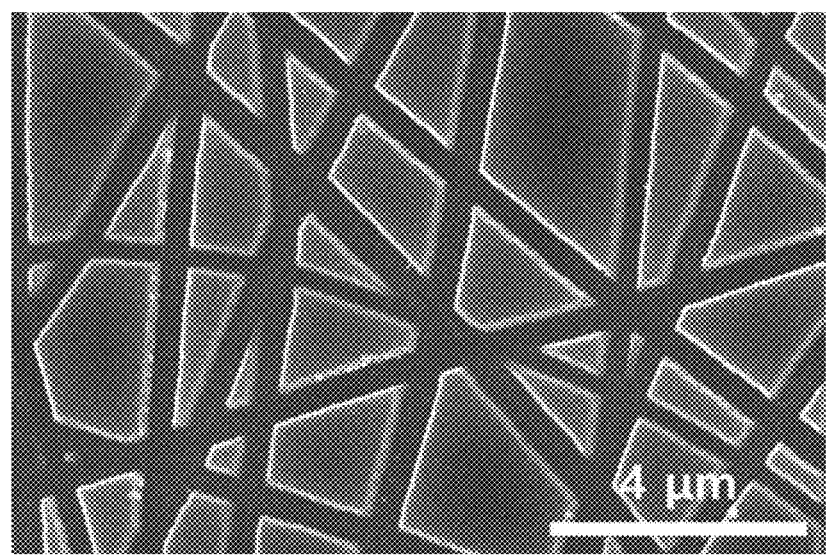
Figure 8:
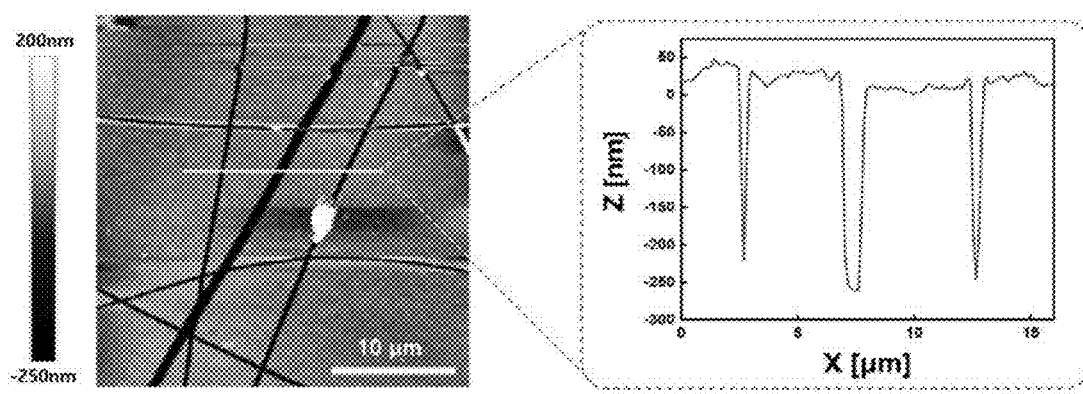
FIG. 8 illustrates an AFM analysis result of the substrate from which PMMA or PVP is removed.

FIGS. 4A to 4C and 6 illustrate photomicrographs of the substrates on which PMMA and PVP are formed, respectively. FIGS. 7A to 7C illustrate SEM pictures of the substrates from which PMMA or PVP is removed. With reference to FIGS. 4A to 4C and 6, electrospun PMMA and PVP can be observed to form nanosized network shapes. With reference to FIGS. 7A to 7C, a region of the substrate which is exposed by removing PMMA or PVP can be observed to match a region in which PMMA or PVP was present. Such results described above are also verified from atomic force microscopy (AFM) analysis results illustrated in FIG. 8.

Figure 9:
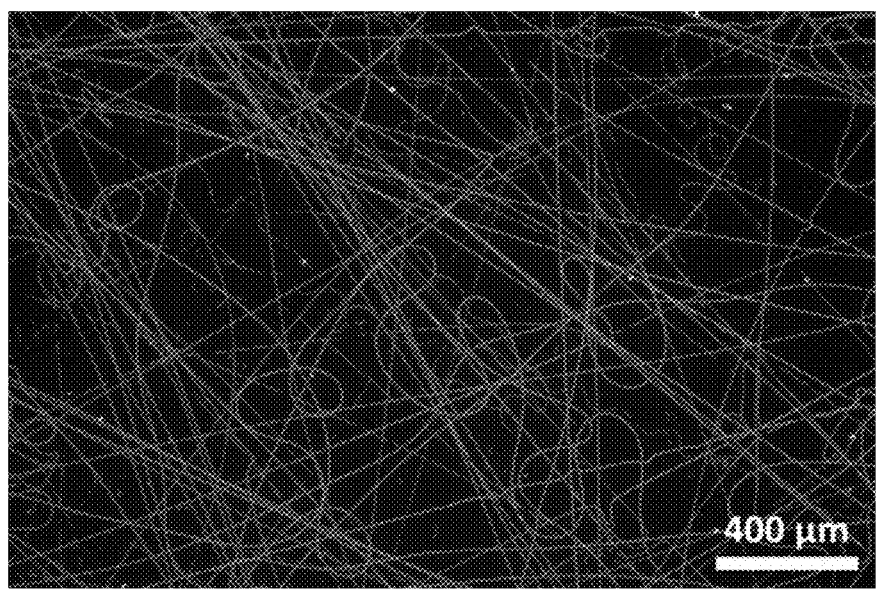
FIGS. 9 and 10 illustrate a photomicrograph and an SEM picture of a substrate on which conductive nanonetworks are formed by filling a region from which PMMA or PVP is removed, with Ag.
Figure 10:
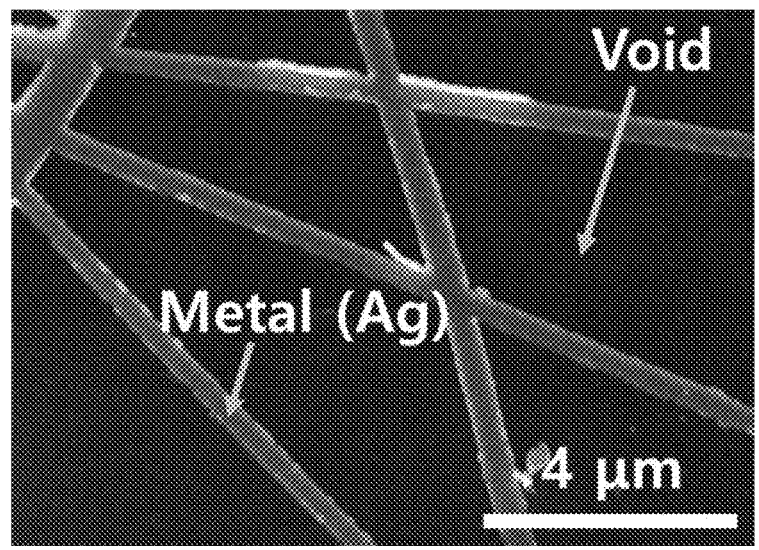
Figure 11:
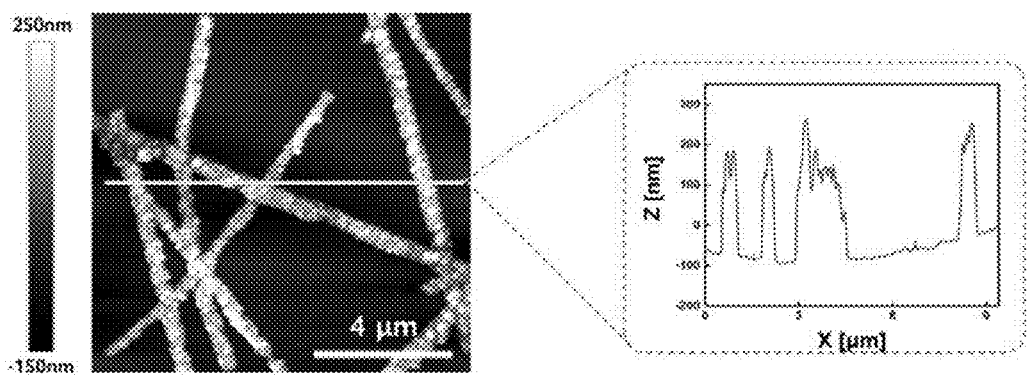
FIG. 11 illustrates an AFM analysis result of the substrate on which the conductive nanonetworks are formed.

FIGS. 9 and 10 illustrate a photomicrograph and an SEM picture of a substrate on which conductive nanonetworks are formed by filling a region, from which PMMA or PVP is removed, with Ag, and the conductive nanonetworks can be observed to be formed into the same shape as the shape of the nanowire networks. Such results described above are also verified from AFM analysis results illustrated in FIG. 11.

Figure 12A:
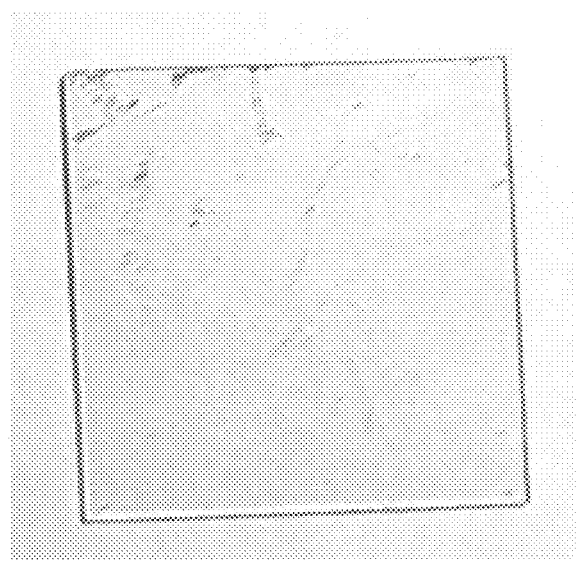
FIGS. 12A to 12C are pictures illustrating states where conductive nanonetworks are formed on a glass substrate, a PET substrate, a thermoplastic polyurethane (TPU) substrate, respectively.
Figure 12B:
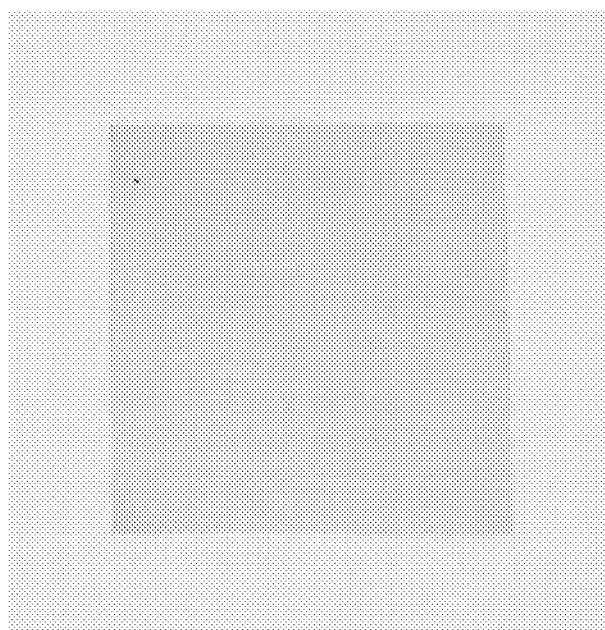
Figure 12C:

FIGS. 12A to 12C are pictures illustrating states where conductive nanonetworks (Ag, liquid metal) are formed on a glass substrate, a PET substrate, a thermoplastic polyurethane (TPU) substrate, respectively, and the conductive nanonetworks can be observed to be present in a transparent state. In addition, sheet resistance is measured both in a state where the Ag conductive nanonetworks are formed on the glass substrate and in a state where the Ag conductive nanonetworks are formed on the PET substrate. The sheet resistance of 100 Ω/sq and 120 Ω/sq is measured to indicate that the Ag conductive nanonetworks have a good sheet resistance property.

Figure 13:
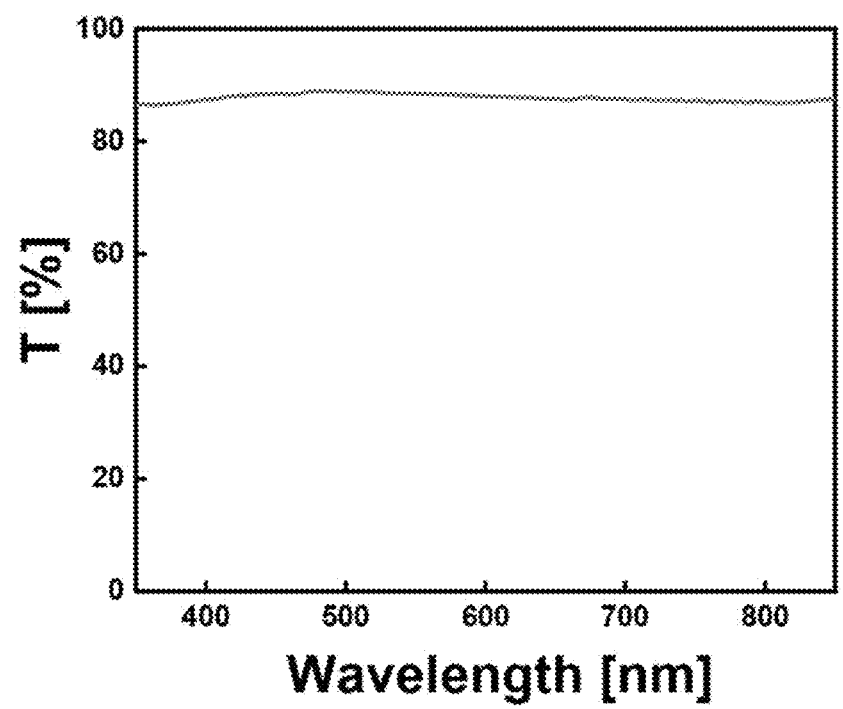
FIG. 13 is an experimental result illustrating a property of optical transmittance of the substrate on which the conductive nanonetworks are formed.

On the other hand, as a result of measuring through UV-vis the optical transmittance of the substrate on which the conductive nanonetworks are formed, the optical transmittance of about 85% or higher can be observed in the visible light wavelength range (400 nm to 700 nm) as illustrated in FIG. 13.

The fabrication method of conductive nanonetworks through adaptation of a sacrificial layer according to the example embodiments of the present disclosure has the following effects.

Since the nanowire networks and the sacrificial layer which define a geometric shape of the conductive nanonetworks are used, the line width, the density, and the height of the conductive nanonetworks may be selectively adjusted, and thus the electrical properties and the optical properties of the conductive nanonetworks may be controlled.

In addition, a connection method of metal nanowires of the related art is excluded, and thus properties of surface roughness and electric resistance of the conductive nanonetworks can be improved.

Besides, since a post-processing process such as a heat treatment or a laser treatment which is performed to improve electric resistance properties does not need to be performed, a flexible substrate may be used without limit, and a conductive nanonetwork process may be applied regardless of properties of a substrate.

Additionally, since the conductive nanonetworks can be formed without applying a semiconductor process such as chemical vapor deposition, photolithography, or an etching process, a nanoelectrode having a large area may be easily fabricated.

While the present disclosure has been described with respect to the specific embodiments, it will be apparent to those skilled in the art that various changes and modifications may be made without departing from the spirit and scope of the invention as defined in the following claims.

What is claimed is:

1. A fabrication method of conductive nanonetworks through adaptation of a sacrificial layer, comprising:
    electrospinning nanowire networks on a surface of a substrate to form the nanowire networks in contact with the surface of the substrate;
    depositing a sacrificial layer on the substrate including the nanowire networks to form the sacrificial layer in contact with the nanowire networks on the surface of the substrate and in contact with the surface of the substrate on which the nanowire networks are not formed;
    removing the nanowire networks with a solvent to expose a region of the surface of the substrate in contact with the nanowire networks, wherein the sacrificial layer formed in contact with the nanowire networks is removed together with the nanowire networks, and the sacrificial layer formed in contact with the surface of the substrate is not removed and remains;
    depositing a conductive material on the substrate including the sacrificial layer to fill a region of the surface of the substrate where the nanowire networks are removed; and
    removing the sacrificial layer formed in contact with the surface of the substrate to expose a region of the surface of the substrate in contact with the sacrificial layer and to form conductive nanonetworks made of the conductive material which fills the region of the surface of the substrate where the nanowire networks are removed, wherein the conductive material formed on the sacrificial layer is removed together with the sacrificial layer, wherein the nanowire networks is poly (methyl methacrylate) (PMMA) or poly (N-vinylpyrrolidone) (PVP), wherein the material of the sacrificial layer is C60 fullerene, wherein the nanowire networks and the sacrificial layer have different dissolution selectivity from each other, and the sacrificial layer formed in contact with the surface of the substrate is not removed and remains during the removing of the nanowire networks with the solvent, wherein the solvent is acetone when using the PMMA as the nanowire networks and the solvent is water when using the PVP as the nanowire networks, and wherein a location and a geometric shape of the nanowire networks are the same as those of the conductive nanonetworks.

2. The fabrication method of conductive nanonetworks through adaptation of a sacrificial layer according to claim 1, further comprising: adjusting a diameter and density of the nanowire networks and a height of the sacrificial layer, and wherein a line width, density, and a height of the conductive nanonetworks are controllable through the step of adjusting of the diameter and density of the nanowire networks and the height of the sacrificial layer.

3. The fabrication method of conductive nanonetworks through adaptation of a sacrificial layer according to claim 1, further comprising: adjusting a diameter of the nanowire networks, wherein the diameter is adjusted by adjusting a process condition of an electrospinning device, and wherein the process condition of an electrospinning device is at least one of a diameter of a needle of the electrospinning device, a voltage applied to the needle, and a concentration of a solution containing a material which is used to form the nanowire networks.

4. The fabrication method of conductive nanonetworks through adaptation of a sacrificial layer according to claim 1, further comprising: adjusting density of the nanowire networks is adjustable by adjusting a process time of the electrospinning.

5. The fabrication method of conductive nanonetworks through adaptation of a sacrificial layer according to claim 1, wherein the substrate is at least one selected from a group comprising of a flexible substrate, a semiconductor substrate, an insulation substrate, and an elastic substrate.

6. The fabrication method of conductive nanonetworks through adaptation of a sacrificial layer according to claim 1, wherein the conductive material is at least one selected from a group comprising of conductive metal, carbon-based conductive material, conductive polymer, and conductive nanoparticles.

* * * * *